(12) United States Patent
Hsieh

(10) Patent No.: US 8,077,461 B2
(45) Date of Patent: Dec. 13, 2011

(54) PORTABLE ELECTRONIC DEVICE WITH MAINTENANCE CAPABILITY

(75) Inventor: Hsing-Yuan Hsieh, Taipei Hsien (TW)

(73) Assignee: FIH (Hong Kong) Limited, Kowloon (HK)

( * ) Notice: Subject to any disclaimer, the term of this patent is extended or adjusted under 35 U.S.C. 154(b) by 397 days.

(21) Appl. No.: 12/421,736

(22) Filed: Apr. 10, 2009

(65) Prior Publication Data

US 2010/0046176 A1 Feb. 25, 2010

(30) Foreign Application Priority Data

Aug. 25, 2008 (CN) .......................... 2008 1 0304176

(51) Int. Cl.
*H05K 7/20* (2006.01)
(52) U.S. Cl. ........ 361/700; 361/752; 361/800; 361/730; 422/5
(58) Field of Classification Search .................. 361/700, 361/730, 752, 728, 800; 174/350, 520; 422/5
See application file for complete search history.

(56) References Cited

U.S. PATENT DOCUMENTS

| | | | |
|---|---|---|---|
| 5,172,307 A * | 12/1992 | Tabuchi et al. ................ 361/502 |
| 7,200,363 B2 * | 4/2007 | Greco et al. .................. 455/66.1 |
| 7,310,539 B2 * | 12/2007 | Chiang et al. ................ 455/567 |
| 7,471,965 B2 * | 12/2008 | Jeon ............................ 455/575.1 |
| 7,877,118 B2 * | 1/2011 | Park ............................ 455/575.1 |
| 2003/0142477 A1 * | 7/2003 | Elias et al. ..................... 361/700 |
| 2004/0203412 A1 * | 10/2004 | Greco et al. .................. 455/66.1 |
| 2004/0204043 A1 * | 10/2004 | Wang et al. .................. 455/556.1 |
| 2004/0235430 A1 * | 11/2004 | Ma et al. ....................... 455/90.1 |
| 2010/0140371 A1 * | 6/2010 | Zuo ............................... 239/34 |

* cited by examiner

Primary Examiner — Dameon Levi
(74) Attorney, Agent, or Firm — Altis Law Group, Inc.

(57) ABSTRACT

A portable electronic device includes a circuit board and at least one treatment element mounted adjacent to the circuit board and storing volatile maintaining matters therein. The circuit board generates heat when the portable electronic device is working to heat the treatment element, and then the maintaining matters volatilize to maintain the portable electronic device.

19 Claims, 4 Drawing Sheets

PORTABLE ELECTRONIC DEVICE WITH MAINTENANCE CAPABILITY

BACKGROUND

1. Field of the Invention

The present invention relates to portable electronic devices, and particularly to a portable electronic device with a maintenance capability.

2. Description of Related Art

Nowadays, portable electronic devices such as mobile phones, laptop computers and personal digital assistants (PDA) are widely used. Similarly to electronic devices, when a portable electronic device has been used for a long time, many components of the portable electronic device may be gradually worn out. For example, the communicating function of the antenna of the portable electronic device can be degraded by rust formed thereon, and the chips of the portable electronic device may be damaged by oxidation. Therefore, these components may often need to be maintained, such as being treated by antioxidants or cleansers.

When electronic devices are maintained, they usually need to be taken apart for maintaining the inner components thereof. However, many portable electronic devices are very small in size. The portable electronic devices are generally difficult to be disassembled, and it is difficult to manually maintain the inner components of the portable electronic devices because of their small size. Additionally, frequent disassembling the portable electronic devices for maintaining may damage their mechanical structures.

Therefore, there is room for improvement within the art.

BRIEF DESCRIPTION OF THE DRAWINGS

Many aspects of the present portable electronic device can be better understood with reference to the following drawings. The components in the various drawings are not necessarily drawn to scale, the emphasis instead being placed upon clearly illustrating the principles of the present portable electronic device. Moreover, in the drawings, like reference numerals designate corresponding parts throughout the figures.

DETAILED DESCRIPTION OF THE EXEMPLARY EMBODIMENT

Figure 1:
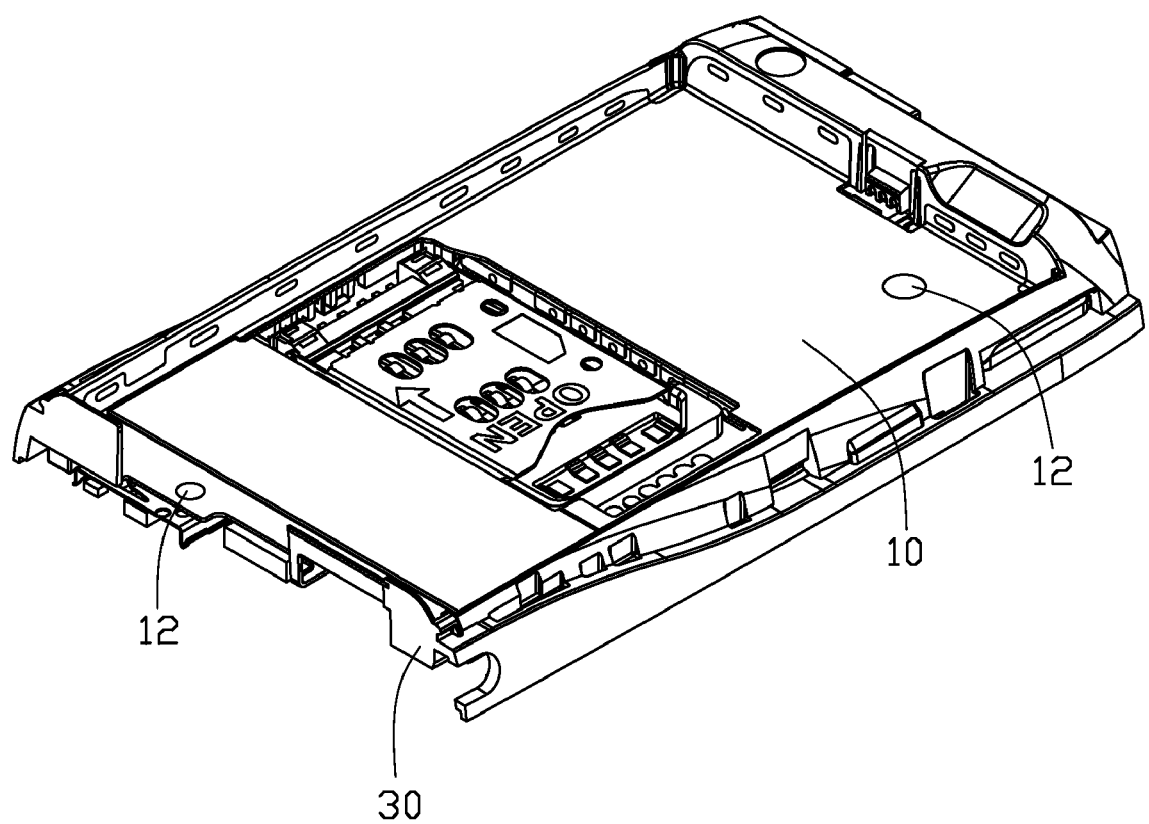
FIG. 1 is a partial, assembled view a portable electronic device, according to an exemplary embodiment.
Figure 2:
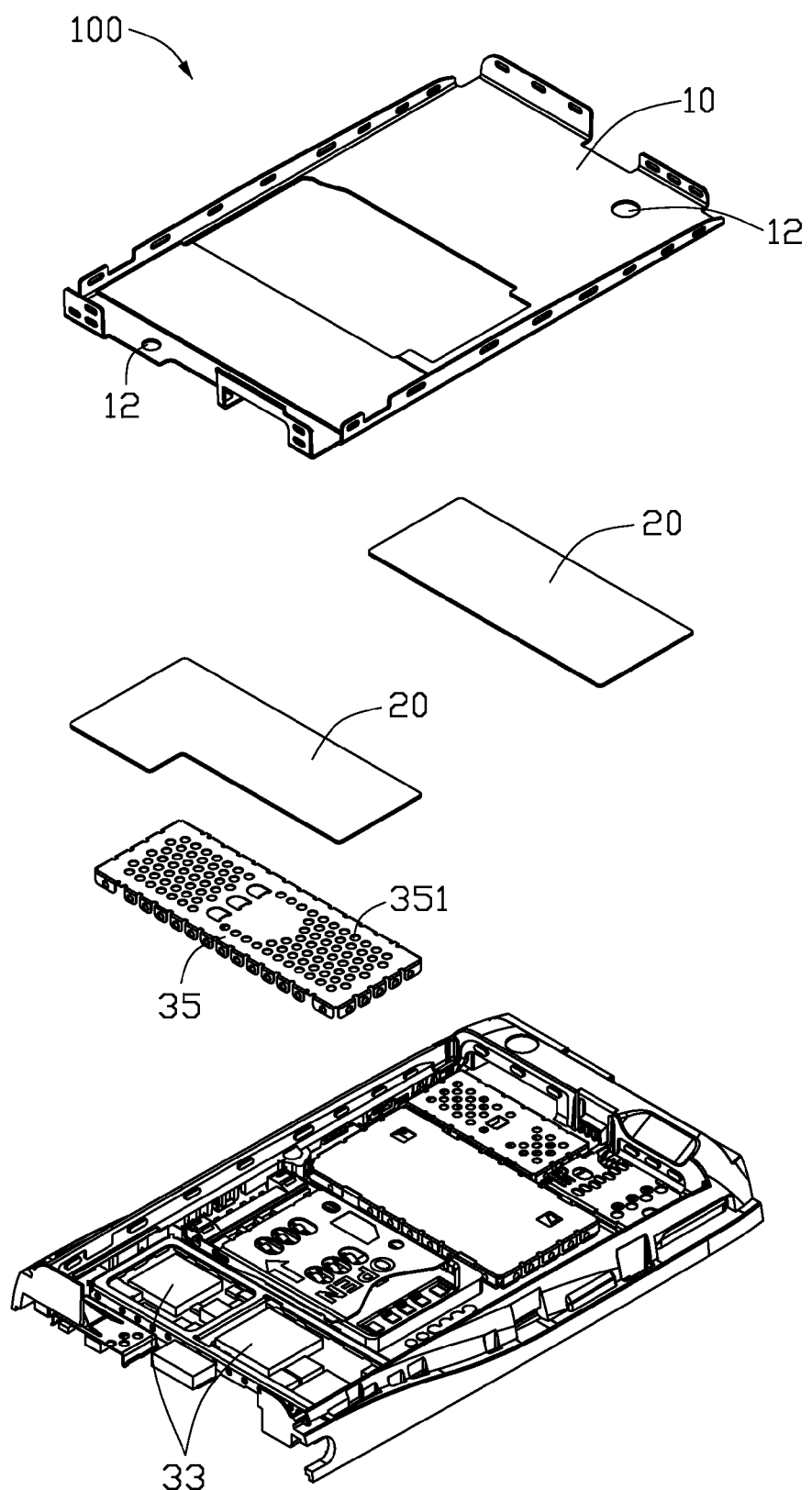
FIG. 2 is a partial, disassembled view of the portable electronic device shown in FIG. 1.
Figure 3:
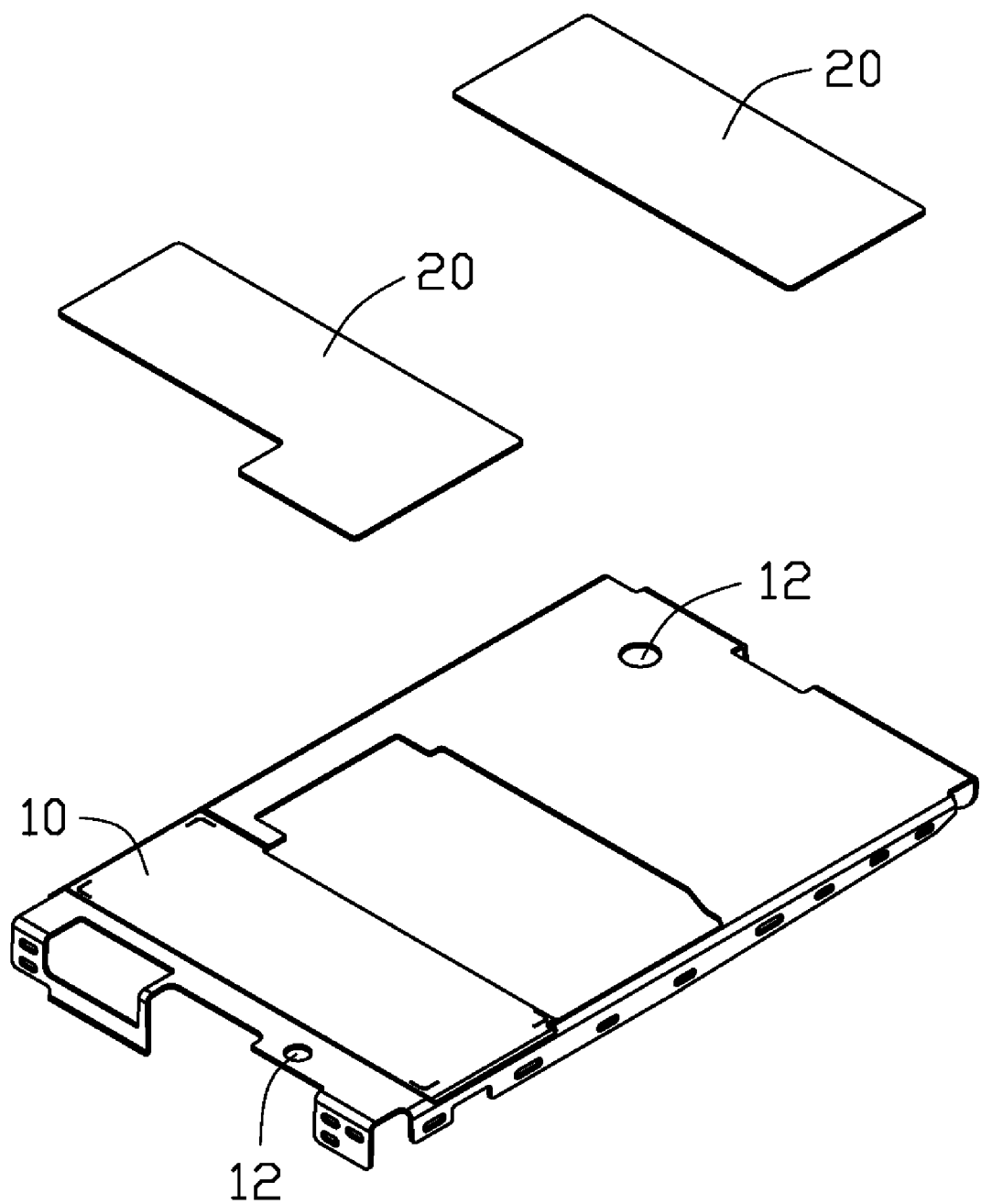
FIG. 3 is a disassembled view of the cover and the treatment elements of the portable electronic device shown in FIG. 1.
Figure 4:
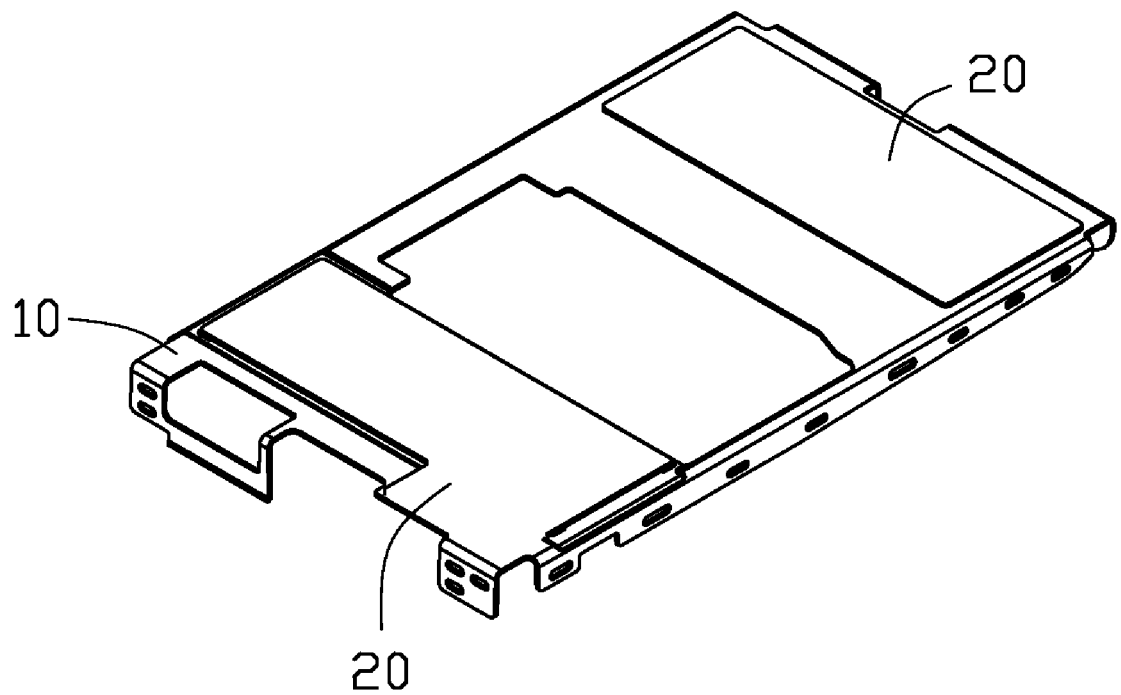
FIG. 4 is an assembled view of the housing and the treatment elements of the portable electronic device shown in FIG. 1.

Referring to FIG. 1 and FIG. 2, a portable electronic device 100 with maintenance capability, according to an exemplary embodiment, is provided. While the exemplary portable electronic device 100 is a mobile phone, it can also be a personal digital assistant (PDA), a laptop computer, etc.

The portable electronic device 100 includes a cover 10, at least one treatment element 20 and a circuit board 30. The cover 10 is an approximately rectangular board, which can be a part of the housing of the portable electronic device 100.

The treatment element 20 is a sheet made of absorptive materials, such as foam, sponge or active carbon, etc. The treatment element 20 is attached to the cover 10. The cover 10 defines at least one injecting hole 12 communicating with the treatment element 20. In the exemplary portable electronic device 100, there are two treatment elements 20 and two injecting holes 12 respectively corresponding thereto.

The circuit board 30 has a plurality of circuit components 33 such as chips, antenna or amplifiers mounted thereon. A shield 35 is mounted on the circuit board 30 and shields the circuit components 33 therein. The shield 35 is made of transcalent materials such as metal and has a plurality of meshes 351 defined therein.

In assembly, the cover 10 is assembled to the circuit board 30. The treatment element 20, the shield 35 and the circuit components 33 shielded in the shield 35 are all placed between the cover 10 and the circuit board 30, and the treatment element 20 is aligned with the shield 35 and the circuit components 33 shielded therein. Volatile treatment liquids, such as antioxidants, cleansers or perfumes, are injected into the injecting hole 12, and then absorbed and stored by the treatment element 20. Additionally, if too much liquid is injected into the injecting hole 12 and overflows, the shield 35 separating the circuit components 33 with the treatment element 20 can protect the circuit components 33 from dampness.

When the portable electronic device 100 is used, the circuit components 33 works and generates heat. The heat is conducted by the shield 35 and then heats the adjacent treatment element 20. As the temperature of the treatment element 20 increases, the volatile treatment liquids stored in the treatment element 20 volatilize. Thus, gaseous maintaining matters can enter the shield 35 through the meshes 351 and maintain the circuit components 33, and can also maintain other components of the portable electronic device 100 out of the shield 35. When the treatment liquids in the treatment element 20 are used up, new liquids can be supplied to the treatment element 20 through the injecting hole 12.

Understandably, the treatment element 20 can also be a changeable solid substance made of solid maintaining matters or comprising solid/liquid maintaining matters, so as the maintaining matters can volatilize when the treatment element 20 is heated. Correspondingly, the injecting holes 12 can be omitted. When the maintaining matters are used up, a new treatment element 20 can replace the previous one.

The exemplary portable electronic device 100 can be automatically maintained when it is in use, thus the conventional manual maintaining operations can be omitted. Further, the portable electronic device 100 need not be disassembled in every time of maintaining, which protects the mechanical structure of the portable electronic device 100.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A portable electronic device, comprising:
    a circuit board;
    at least one treatment element mounted adjacent to the circuit board and storing volatile treatment liquids therein; and a shield defining a plurality of meshes therein, the shield shielding a part of the circuit board to prevent the part of the circuit board from being dampened by the treatment liquids;

wherein the circuit board generates heat to heat the treatment element when the portable electronic device is working, and then the treatment liquids volatilize and enter the shield through the meshes to maintain the part of the circuit board shielded by the shield.

2. The portable electronic device as claimed in claim 1, wherein the treatment liquid is selected from the group consisting of antioxidants, cleansers and perfumes.

3. The portable electronic device as claimed in claim 1, further comprising a cover assembled to the circuit board, and the treatment element is mounted on the cover.

4. The portable electronic device as claimed in claim 3, wherein the treatment element is made of absorptive material, and the volatile treatment liquid is absorbed in the treatment element.

5. The portable electronic device as claimed in claim 4, wherein the treatment element is made of any one selected from the group consisting of foam, sponge and active carbon.

6. The portable electronic device as claimed in claim 4, wherein the cover defines at least one injecting hole communicating to the treatment element for supplying volatile treatment liquid to the treatment element.

7. The portable electronic device as claimed in claim 3, wherein the treatment element is a changeable solid substance made of solid maintaining matter or storing solid/liquid maintaining matter therein.

8. The portable electronic device as claimed in claim 1, wherein the shield is made of transcalent material.

9. A portable electronic device, comprising:
a circuit board;
a cover assembled to the circuit board;
at least one treatment element attached to the cover and placed between the circuit board and the cover, wherein the treatment element comprises volatilize maintaining matter, and the maintaining matter automatically volatilizes to maintain the portable electronic device; and
a shield defining a plurality of meshes therein and shielding a part of the circuit board; wherein when the maintaining matter has not volatilized, the shield separates the part of the circuit board from the maintaining matter; and when the maintaining matter has volatilized, the gaseous maintaining matter enters the shield through the meshes to maintain the part of the circuit board shielded by the shield.

10. The portable electronic device as claimed in claim 9, wherein the maintaining matter volatilizes when the circuit board generates heat in working process to heat the treatment element.

11. The portable electronic device as claimed in claim 9, wherein the maintaining matter is selected from the group consisting of antioxidants, cleansers and perfumes.

12. The portable electronic device as claimed in claim 9, wherein the treatment element is made of absorptive material, and the maintaining material is liquid material absorbed in the treatment element.

13. The portable electronic device as claimed in claim 12, wherein the treatment element is made of any one selected in the group consisting of foam, sponge and active carbon.

14. The portable electronic device as claimed in claim 9, wherein the cover defines at least one injecting hole communicating with the treatment element for supplying liquid maintaining matters to the treatment element.

15. The portable electronic device as claimed in claim 9, wherein the treatment element is a changeable solid substance made of solid maintaining matter or storing solid/liquid maintaining matter therein.

16. The portable electronic device as claimed in claim 9, wherein the shield is placed between the circuit board and the cover and aligned with the treatment element.

17. The portable electronic device as claimed in claim 16, wherein the shield is made of transcalent material.

18. The portable electronic device as claimed in claim 1, wherein the treatment liquids further maintain parts of the portable electronic device that are positioned out of the shield when volatizing.

19. The portable electronic device as claimed in claim 9, wherein the maintaining matter further maintains parts of the portable electronic device that are positioned out of the shield when volatizing.

* * * * *